United States Patent [19]
Blanchard

[11] 4,215,337
[45] Jul. 29, 1980

[54] DUAL-DISC SHAFT POSITION ENCODER

[75] Inventor: Stanley J. Blanchard, Danbury, Conn.

[73] Assignee: Unimation Inc., Danbury, Conn.

[21] Appl. No.: 25,935

[22] Filed: Apr. 2, 1979

Related U.S. Application Data

[63] Continuation of Ser. No. 933,828, Aug. 15, 1978, abandoned.

[51] Int. Cl.$^2$ .............................................. G06F 3/00
[52] U.S. Cl. .......................... 340/347 P; 235/92 MP
[58] Field of Search ............... 340/347 P, 347 M, 671; 235/92 MP; 250/231 SE

[56] References Cited

U.S. PATENT DOCUMENTS

| | | | |
|---|---|---|---|
| 2,793,807 | 5/1957 | Yaeger | 340/347 P |
| 3,122,735 | 2/1964 | Townsend | 340/347 P |
| 3,525,094 | 8/1970 | Leonard | 340/347 P |
| 3,778,833 | 12/1973 | Castrovillo | 235/92 MP |
| 4,041,483 | 8/1977 | Groff | 340/347 P |

Primary Examiner—Charles D. Miller

[57] ABSTRACT

The disclosed forms of shaft-position encoder employ "fast" and "slow" rotary selectors coupled by gearing to each other and to the shaft whose position is to be encoded. The selectors cooperate selectively with elements in respective "fast" and "slow" circular series of elements. Two counters register the number of pulses in respective pulse trains, the number of pulses in a train varying in accordance with the number of elements in each of the "fast" and the "slow" series between one end of the series and an element in cooperation with a related selector. The combined values registered in the counters represents the shaft position code. The inherent uncertainty in recognizing when the "slow" counter should register any particular value represented by the position of its selector along its series of elements could create significant ambiguity, which is here resolved through use of the value registered in the counter of the "fast" series of elements.

12 Claims, 4 Drawing Figures

DUAL-DISC SHAFT POSITION ENCODER

This is a continuation of application Ser. No. 933,828 filed Aug. 15, 1978 now abandoned.

The present invention relates to shaft position encoders.

BACKGROUND

The present invention represents an improvement on the encoders disclosed in an application of George C. Devol, Ser. No. 507,082 filed Sept. 18, 1974 now abandoned. That encoder includes a rotary selector that cooperates with a circular series of elements. A train of pulses is developed by successively testing the elements, limiting the number of pulses in a train in accordance with how many elements there are between an element selected by the selector and the start or the end of the series of elements. The pulses are entered into a counter that provides a code representing the shaft position.

The physical limitation on how close one element can be located to the adjacent elements of the series imposes a limitation on how many discrete positions can be encoded with a practical size of the circular series of elements. This depends on the form of element used (magnetic, capacitive, photosensitive, etc.) and the circuit used to recognize cooperation of the selector with the element. The broad proposition was recognized by George C. Devol that the number of discrete codes for a shaft position encoder can be increased by changing from one circular series of elements and a rotary selector, to two selectors coupled to the shaft whose position is to be encoded and coupled to each other by gearing such that the "fast" selector moves through its entire range while the "slow" selector advances from one element to the next.

SUMMARY OF THE INVENTION

The present invention is directed toward improving on the dual-selector aspect of the Devol shaft position encoder. The value entered into the counter of the pulses produced by cooperation of the "slow" selector with its series of elements has a degree of uncertainty in the transition range of selector positions from one element to the next. And yet, since the value in the counter of the "fast" selector is an important part of the shaft-position code represented by the combined values registered in the "slow" and "fast" counters, an uncertainty of one count in the "slow" counter is basically unacceptable. As an exception to this general statement, ambiguity of this kind at the extreme ends of the range of the "slow" selector is of no concern in many applications of shaft position encoders. Ambiguity of one step in the range of the "fast" selector (where such ambiguity occurs) represents a limit on the precision of the encoder.

An object of this invention resides in providing a two-selector shaft position encoder generally as outlined above, having means for meeting the foregoing ambiguity problem.

In practical forms of apparatus, each selector is part of a disc, and therefore it has been found convenient to use "fast" and "slow" as terms of reference to relate the fast and slow shafts to the selectors, the two series of elements that cooperate with respective selectors, and the related counters. Also, in the specific description below of illustrative embodiments of the invention, the selector is a light beam and the elements that cooperate with the respective selectors are phototransistors, but it will be understood that those devices are included as the best mode that is presently contemplated for implementing the invention. Other forms of photosensitive electrical elements such as photoresistors may replace the disclosed phototransistors so long as a light beam is used as the selector, and other devices (contact, magnetic field sensitive, capacitive, etc.) may be used when different forms of selector (contact, magnet, capacitive, etc.) are used.

In the specifically disclosed apparatus described below, the transition regions of the selector represented by entry of one "count" or the next into the "slow-disc" counter between its opposite extremes are rendered unambiguous by providing input from the "fast-disc" counter to the "slow-disc" circuit. Thus, for values approaching the maximum of the "fast-disc" counter (63 in the illustrative examples), the "slow-disc" circuit responds distinctly differently that it does for zero or values near zero. As will be seen, the described circuits which employ a light beam and phototransistors have a broad tolerance to variations in the beam width and the proportions, placement, and light-responsive characteristics of the phototransistors, arising in part out of using half of the capacity of the "fast-disc" counter as a criterion for establishing a given count or one count more in the "slow-disc" counter. Additionally, in some circuits it is useful to ascertain whether one phototransistor (or its equivalent) or more than one are changed from "off" or "dark" to "on" or "lit", as a further or supplemental criterion for resolving the ambiguity.

Where a two-disc system is employed, one might consider executing a complete cycle of operation of the "fast-disc" circuit for each advance of one count in the counter of the "slow disc" circuit. For the largest possible number needed with binary counters to represent a shaft position, even at very high pulse frequencies, a relatively long time interval would be needed to complete one operation of the system in deriving the desired position code. This is objectionable for at least two reasons. First, the shaft may be moving, and frequent accurate codes of the shaft position may be important. Therefore it is an advantage to devise a system providing frequent shaft position codes. Secondly, a malfunction might occur on occasion due perhaps to a spurious signal, and if only a short time is needed in the operation of the system, the consequence of an occasional erroneous code is minimized by frequent available correct codes. This is achieved by subdividing the system cycle into a "fast-disc" cycle and a "slow-disc" cycle each of which is completed separately. In that way, the total time for the system cycle is, at maximum, the sum of the "slow-disc" cycle time and the "fast-disc" cycle time. In a system employing $2^{10}$ or 1024 elements in the "slow-disc" circuit and $2^6$ or 64 elements in the "fast-disc" circuit, a maximum cycle time for the system when operated at a frequency of 10 megahertz can be little more than 1/10 of a millisecond, with new shaft position codes available at about 6,000 per second or more frequently on average.

The nature of the invention and its foregoing and other novel features and advantages will be better appreciated from the following detailed description of several illustrative embodiments, referring to the accompanying drawings.

BRIEF DESCRIPTION OF THE DRAWINGS

In FIGS. 5 and 6 the "slow-disc" beam is centered on a phototransistor of the "slow-disc" series when the "fast-disc" counter registers zero, the beam in FIG. 6 being wider than that in FIG. 5. In FIGS. 7 and 8, the "slow-disc" beam is centered in the center-to-center space between two phototransistors of the "slow-disc" series when the "fast-disc" counter registers zero, the beam being wider in FIG. 8 than in FIG. 7.

Figure 1:
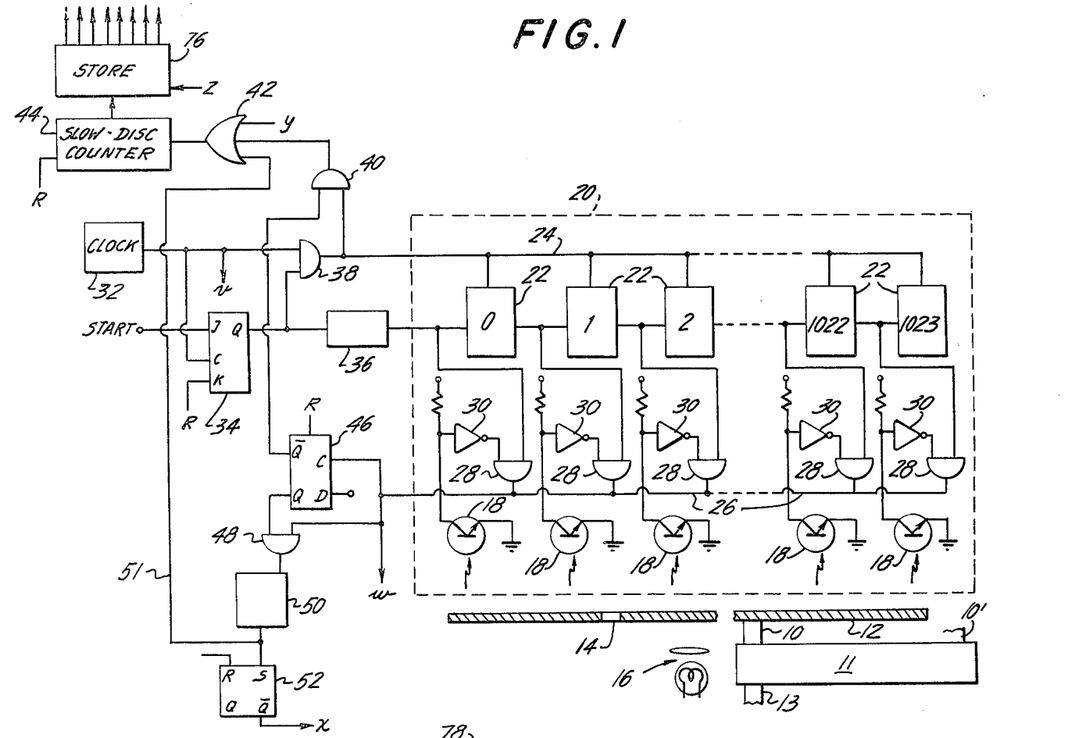
FIGS. 1 and 2 together represent a block diagram of one embodiment of various aspects of the invention.
Figure 2:
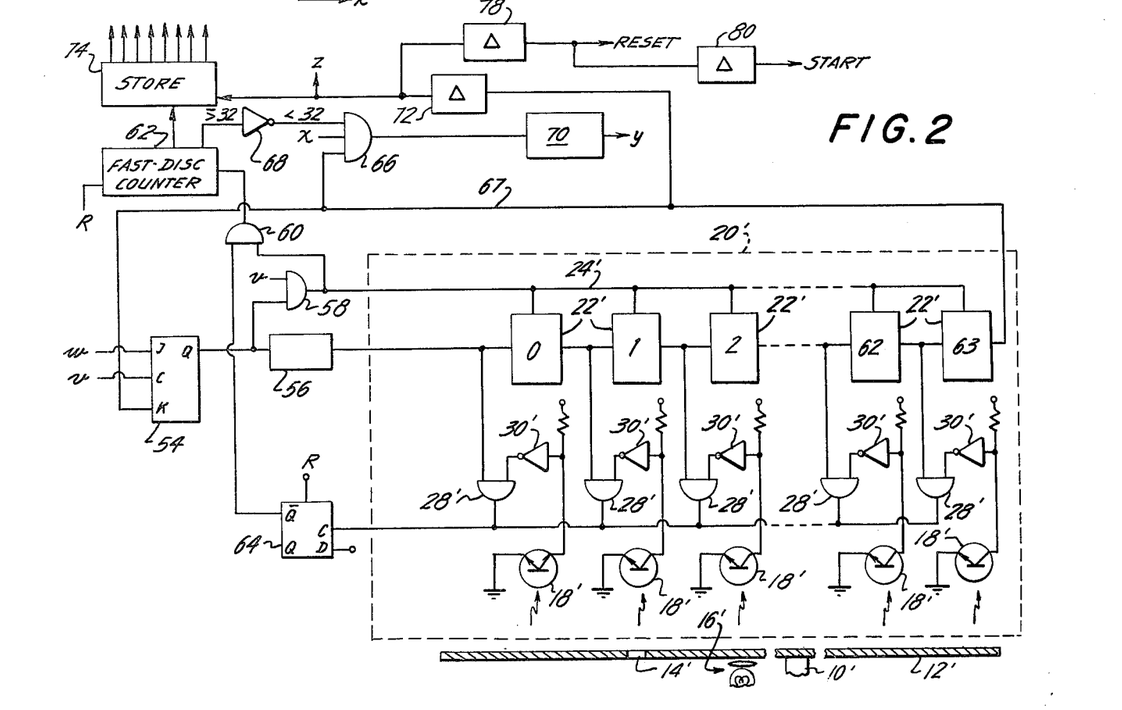

FIGS. 1 and 2 together represent an embodiment of various features of the invention. Slow shaft 10 is coupled by gearing 11 to shaft 13 whose position is to be encoded, and shaft 10' (FIG. 2) is geared to shaft 10 by a step-up ratio such as 64:1 in a particular example. Suitable means may be built into the gearing to take up looseness, or prevent backlash. Such gearing is shown in U.S. Pat. No. 3,525,094 issued Aug. 18, 1970 to G. H. Leonard. Each shaft carries a respective disc or mask 12, 12' having a corresponding aperture 14, 14' near its rim. Light from a source 16, 16' produces a beam through aperture 14, 14' broad enough to "light" at least one phototransistor 18, 18' but not more than two phototransistors in all relative positions of the aperture and the phototransistors. These phototransistors are arranged in respective circles, to be scanned by the beams through apertures 14, 14'.

Figure 5:
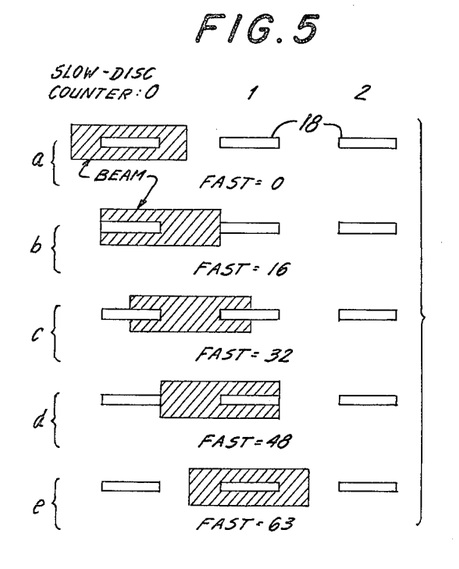
FIGS. 5–8, inclusive, represent varied conditions of the "slow-disc" selector and its elements in the system of FIGS. 1 and 2 or that of FIGS. 3 and 4, the selector being a light beam in those systems and the "slow-disc" series of elements being phototransistors in those systems.
Figure 6:
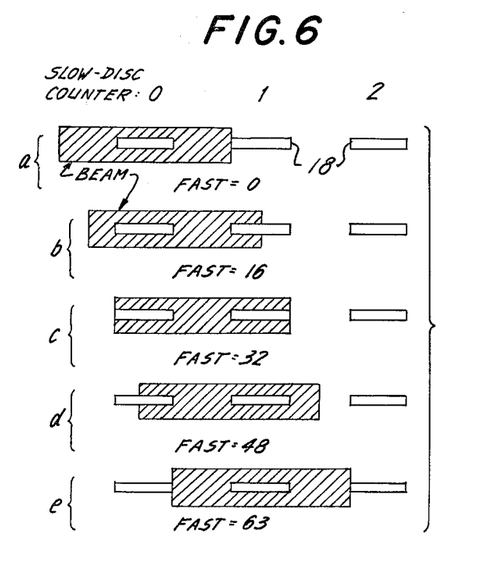

FIGS. 5 and 6 illustrate changing positions of a beam of light from source 16 through hole 14 in relation to a few phototransistors 18 of the low-speed disc. In FIG. 5, the beam is assumed to have an effective width equal to the sensitive width of one phototransistor plus the equal width of the insensitive space between sensitive areas of two successive phototransistors. In FIG. 6 the beam is assumed to have an effective width of two sensitive areas plus a space between them as wide as a photosensitive area. In FIGS. 5 and 6, all of the photosensitive areas are of uniform width, equal to the uniform width of the spaces, and a phototransistor is considered "lit" when half of its sensitive area is illuminated. In FIGS. 5 and 6 the digital position of the fast disc and the slow disc are both zero when centered at the "zero" phototransistor. The shaded areas represent the beam. "Fast" represents the value in the fast-disc counter.

The "rules" of logic that apply to both FIG. 5 and FIG. 6 are as follows:

I. If two phototransistors are "lit", the one representing the correct digit is the lower-value one.

II. If only one phototransistor is "lit":
   (a) It represents the correct digit if fast disc count is less than 32; and
   (b) It represents one more than the correct digit if the fast disc equals or exceeds 32.

These rules are not absolute, in that, in ordinary practice two phototransistors may act "lit" for fast-disc values of roughly 24 through 40 for FIG. 5, and in ordinary practice two phototransistors may act "lit" for fast-disc values of roughly 8 through 56 for FIG. 6.

In FIG. 5, rule I applies only to condition c, rule II(a) applies to conditions a and b, and rule II(b) applies to conditions d and e. The moment that the fast disc passes from 63 to 0, rule II(a) applies.

In FIG. 6, rule I applies to conditions b, c and d, rule II(a) applies to condition a and rule II(b) applies to condition e.

The values "0", "1" and "2" in FIGS. 5 and 6 represent the digital designations of position of the slow disc, in a circuit where the slow-disc counter in its "Reset" condition contains it maximum value, e.g. 1023. (If the counter were reset to zero, then the position designations "0", "1" and "2" in FIGS. 5 and 6 would be changed to "1", "2", and "3".)

For rule I, one count should be entered into the counter after making the determination that two phototransistors are lit.

For rule II, (a) one count should be entered into the slow-disc counter after making the determination that the fast-disc counter reads less than 32.

For rule II(b), one count will be entered into the slow-disc counter automatically in the circuit of FIGS. 1 and 2, since the determinations of rules I and II(a) proved to be negative. This last operation results in the slow-disc counter reading the same for condition (e) when "1" is lit as for condition (a) when the next-lower "0" is lit.

The fringing effect of the beam and the responsiveness of the phototransistors could act so that (FIG. 5) rule II(a) continues to apply (for example) throughout the range of fast-disc values from 0 to 20, being conditions a and b, and such that rule II(b) continues to apply throughout the range values from 44 through 63, being conditions d and e. The fringing effect at the margin of the beam and the minimum area of a phototransistor that must be illuminated to be "lit" can also be modified from the proportions in FIG. 6, with modified behavior. And yet the digitally encoded shaft position is—unambiguously—the combined values registered in two counters that separately represent the positions of the slow disc and the fast disc. For like reasons, minor inaccuracy in simultaneously positioning the "0" phototransistors of the slow-disc circuit and the fast-disc circuit precisely at the center of their beams is not critical.

It is contemplated that each of the circuits 20, 20' (enclosed in dotted rectangles) may be fabricated as an integrated circuit, each on its own semiconductor wafer.

The circuit of FIG. 1 identified with the slow disc 12 may now be described. A series of shift-register stages 22 (labeled "0" through "1023") have respective clock inputs from bus 24. Each stage (except the last) has its output coupled to the next in the series. An input signal to the first and each succeeding stage acts to condition that stage to respond to a clock pulse so as to produce an output signal for conditioning its following stage to respond similarly to the next clock pulse. There are $2^{10}$ or 1024 successive stages in an example.

Between the input to each stage and a common signal bus 26 there is an "and" gate 28, which may be identified as gate "0", "1", etc. identified with the shift-register stages "0" through 1023. Each of these "and" gates has its other input controlled by a corresponding phototransistor 18 and an inverter 30. As the changed state of each stage 22 is shifted along the series of stages, the output state of each stage in succession enables the "and" gate 28 of that next stage to pass a "high-state" signal to bus 26 if the corresponding phototransistor 18 is "lit".

A cycle of operation starts with application of a "start" signal to the J terminal of the J-K flip-flop 34. Clock-pulse generator 32 produces pulses at a rate of 10 megahertz, for example. Input terminal c of flip-flop 34 responds to the fall of a clock pulse to cause terminal Q of this flip-flop to shift to its "high" output state. Monostable multivibrator 36 then acts to generate an input pulse to the initial or "0" stage 22 of the shift register. Additionally, enabling bias is applied to the second input of two-input "and" gate 38. This gate is thus conditioned to transmit succeeding clock pulses. Clock pulses are thus applied to bus 24, and the clock pulses are also transmitted via "and" gate 40 and "or" gate 42 in succession to counter 44, a 10-stage (10-bit) binary counter in this example. At this time, flip-flop 46 is in its reset state, so that its $\overline{Q}$ output is applied to the second input of "and" gate 40, enabling gate 40 to transmit the clock pulses to counter 44.

When a pulse from one-shot 36 reaches the first stage 28 of the shift register, if its phototransistor 18 is "lit", that pulse is also transmitted to output bus 26. A connection of bus 26 to flip-flop 46 causes the rise of the pulse to set this flip-flop, immediately disabling gate 40 and blocking the first clock pulse and all others from the slow-disc counter 44. Whether the first phototransistor 18 is or is not "lit", the first clock pulse on bus 24 shifts the "high" input at the first stage 22 to its output and provides "high" input to the next shift-register stage and to the gate 28 of its associated phototransistor 18. If that phototransistor is also "lit", a second pulse appears on common output bus 26. The previous (first) output pulse on bus 26 was effective to set flip-flop 46. The Q output of this flip-flop applied enabling bias to the input of gate 48. Thus the second pulse on bus 26 (resulting from the second "lit" phototransistor) passes "and" gate 48 to a "2-lit" one-shot, monostable multivibrator or pulse generator 50. This pulse is transmitted via connection 51 and "or" gate 42 to add one count to counter 44. Accordingly, whenever two phototransistors are exposed to the beam or sufficiently shifted from their "dark" state to be effectively "lit", an additional pulse will reach the counter. As will be seen, one added pulse reaches the counter in case only one phototransistor is "lit", where the counter associated with the high speed disc equals or exceeds 32, half of its capacity. However, the latter added pulse should not reach counter 44 where two phototransistors are "lit" and two pulses appeared on bus 26. Therefore the "2-lit" one-shot multivibrator 50 sets bistable flip-flop 52, producing a bias at output x that is used to disable the add-one pulse circuit of the fast disc.

The pulse from "one-shot" 36 is applied to the first stage 22, to gate 28 and to latch 46 before the first clock pulse is applied through bus 24 to all the shift register stages 22. Therefore, if the first phototransistor 18 is "lit", latch 46 is set and gate 40 is blocked before the first clock pulse reaches gate 40 via gate 38. Correspondingly, after a pulse from one-shot 36 is applied to the first shift register stage 22 and a clock pulse is applied to that first stage, the input to the second shift-register stage changes; and that change takes place before the next clock pulse. Thus no clock pulse is entered into the counter via gate 40 if the first phototransistor is "lit" regardless of whether the second phototransistor is or is not "lit". Only one pulse is entered into the counter via gate 40 if the second phototransistor is the first or only one "lit".

The rules of logic described above in connection with FIGS. 5 and 6 are satisfied by the operation of the whole circuit. In this discussion, it is understood that when slow-disc counter 44 is reset, it contains its maximum value; so that the first input pulse causes the counter to read "0".

In case the first two phototransistors are "lit", one count is entered into the counter via line 51. Meeting Rule I, this is the only count that reaches counter 44. No clock pulse can reach OR gate 42 via gate 40 because the latter was blocked by flip-flop 46 before the first pulse on clock bus 24, and no pulse can reach input y of OR gate 42 because output x of R-S latch 52 acts (see below) to block such input. In case only the first phototransistor 18 is "lit", no pulse reaches gate 42 via connection 51 and latch 46 has blocked gate 40 before the first pulse. However, as will be seen from the description (below) of the circuit in FIG. 2, a "less-than-32" pulse y passes gate 42 and is registered in the counter. Finally, if only the second phototransistor 18 is "lit" and the fast-disc count is greater than 32, latch 46 is not set until the output of the "0" stage 22 has changed so that the first clock pulse passes through gates 38, 40 and 42 to the counter. At this time no pulse appears on connection 51 since only one phototransistor is "lit", and no pulse y appears because the fast-disc counter exceeds 32.

What has been said above to demonstrate entry of one count into register 44 if either of the first two phototransistors is "lit" applies similarly to the entry of two counts into the register if only the second or the third phototransistor is "lit" and if both the second and third phototransistors are lit. Thus, if only the second phototransistor 18 is lit and the fast-disc counter registers less than 32, two pulses enter the counter. The rules of logic apply to all the shift-register stages.

The appearance of an output pulse on common bus 26 provides a means for starting a cycle of the fast-disc circuit. Terminal w (FIG. 1) is connected to the J setting input of bistable flip-flop 54 (like device 34 in FIG. 1). Clock output terminal v (FIG. 1) is connected to the c input terminal of flip-flop 54. As in FIG. 1, the fall of this clock pulse causes the Q terminal of bistable J-K flip-flop 54 to develop "high" output. This triggers one-shot 56 to produce an input pulse to the "0" stage 22'. This Q output of device 54 also enables "and" gate 58 to transmit clock pulses to line 24' and to "and" gate 60, thence to the counter 62 of the high-speed disc. Initially bistable flip-flop 64 produces output at its $\overline{Q}$ terminal that enables "and" gate 60.

Accordingly, after a "start" signal from terminal w (FIG. 1) to flip-flop 54, clock pulses at input v of gate 58 are transmitted to the counter. Clock pulses from gate 58 are also applied to bus 24' of the shift register stages 22'. As in the apparatus of FIG. 1, the first "lit" phototransistor 18' causes a pulse to appear on common signal bus 26'. This output reaches input terminal c of flip-flop 64, reversing its state and disabling "and" gate 60 from transmitting further clock pulses to counter 62.

The output pulse of pulse generator 56 continues to be shifted along shift register stages 22', ultimately leaving the last stage 22', designated "63". That pulse on line 67 appears as input to terminal K and reverses flip-flop 54, and conditions this flip-flop for response to a new "start" signal w and a clock pulse v at terminal c. Output on line 67 from the "63" stage 22' of the shift register also appears as an input pulse to "and" gate 66. One enabling gate input x is controlled by output terminal $\overline{Q}$ of flip-flop 52 (FIG. 1). If "2-lit" one-shot 50 were to operate during the cycle of the slow disc, terminal x would disable gate 66; otherwise terminal x provides an enabling bias. A third input to gate 66 is from the last stage of binary counter 62, through inverter 68, such that this third input to gate 66 becomes enabled when the count in counter 62 equals or exceeds 32. Consequently, if only one phototransistor 18 of the slow disc were "lit" and if the count in counter 62 is less than 32 when a pulse appears on bus 67, gate 66 produces an output pulse. This causes "add one" one-shot multivibrator 70 to apply an input pulse via input terminal y of "or" gate 42 (FIG. 1) to the slow-disc counter. For count values in counter 62 above 32, no add-one pulse appears at terminal y.

After a time delay, a pulse on bus 67 through delay unit 72 strobes transfer of the count in counter 62 to store or latch unit 74. Simultaneously this pulse at the output of delay unit 72 appears at strobe connection z of store or latch unit 76, to cause transfer and storage of the value in the slow-disc counter 44.

Output of delay unit 72 to further delay unit 78 yields a reset pulse to flip-flops 34, 46, 52 and 64 and counters 44 and 62.

Output from delay 78 to delay 80 yields a "start" signal for flip-flop 34.

The phototransistors 18' of the fast disc are distributed at uniform center-to-center spacing around 360 degrees. The first "lit" phototransistor interrupts the counting operation. First and second "lit" phototransistors of the slow disc yield appropriate pulses in the slow-disc circuit, such that there is no ambiguity in the combined values registered in the two counters. This is compatible with the criterion that at least one phototransistor 18 is to be "lit" for all positions of shaft 10, and at least one phototransistor 18' is to be "lit" for all positions of shaft 10'.

If the "0" stage 22 and the "1023" stage 22 are both "lit" (and if those phototransistors were to have the same separation as that existing between the others), the foregoing description of operation would yield an erroneous result. Added "logic" circuitry could avoid such error. However, even if that condition (both "0" and "1023" being lit) were to create difficulties, it is a condition that would not occur in most practical situations since those two extreme phototransistors of the slow disc are ordinarily spaced apart so far that they cannot both be lit at once.

The entire range of the encoder is $2^{16}$ discrete encoded positions represented by the combined outputs of the two counters and stores 74 and 76. And yet the maximum duration of the encoding cycle here amounts to $2^{10}$ plus $2^6$ or 1648 clock pulses, only about 2% of the time required for the 65,536 clocks that would be occasioned in a system involving delivery of one clock pulse to the circuit of the slow disc upon completion of each cycle of the circuit of the fast disc. Indeed, the duration of the cycle of a single-disc circuit capable of evidencing only $2^{11}$ discrete positions (giving much poorer identification of shaft position than $2^{16}$ positions in the example above, would involve a cycle duration of 2048 clock pulses, more time than the maximum cycle time of 1648 clock pulses in the above example. New codes representing or verifying the position of shaft 13 are available at least 6000 times per second in this example. Minimum cycle duration is important as may be appreciated from the fact that the shaft is (or may be) rotating during the encoding operation, and an unduly long cycle in relation to the speed of the shaft could introduce inaccuracy or even mis-operation.

It will be recalled that "one-shot" 56 provides an input pulse to the fast-disc shift register. That pulse continues to be shifted down the series of shift-register stages with each clock pulse on line 24'. The shifted pulse emerges from the last stage and resets latch 54, and the fast-disc cycle is complete. Conventional means (not shown) can be used to reset or clear the shift registers.

Figure 3:
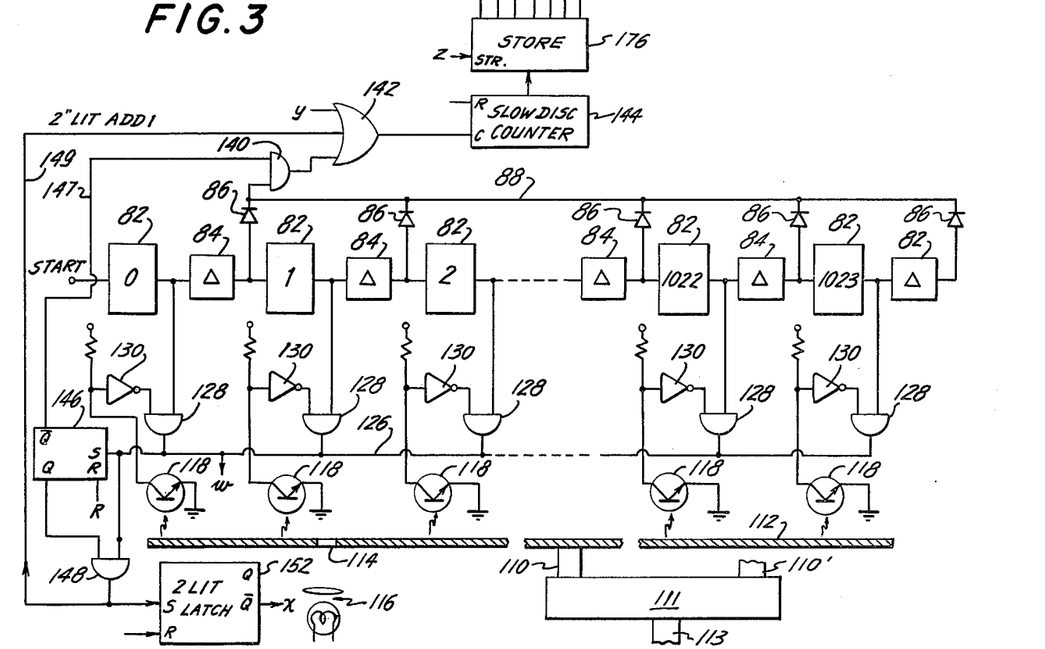
FIGS. 3 and 4 together represent a block diagram of a second embodiment of various aspects of the invention.
Figure 4:
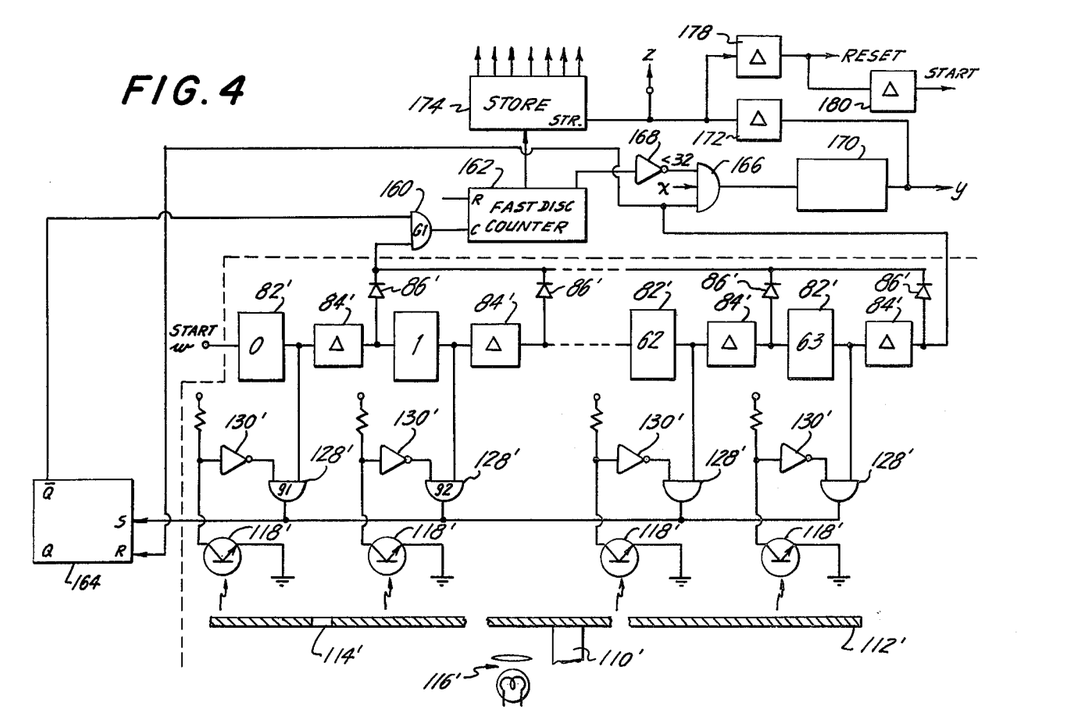

The embodiment of FIGS. 1 and 2 uses a shift register activated by a clock pulse generator in conjunction with the phototransistors which respond to the position of the aperture in the disc. In FIGS. 3 and 4 a second embodiment is illustrated, in which a sequence of one-shot multivibrators replaces the shift register of each disc and the activating clock in FIGS. 1 and 2, demonstrating that the broad concept is not identified with shift registers. Numerals are used in FIGS. 3 and 4 with a prefix "1" for parts corresponding to like parts in FIGS. 1 and 2. Their nature and function are not described again, being understood from the description of FIGS. 1 and 2.

FIG. 3 represents the circuit associated with the slow disc 112. A signal from FIG. 4 at the START terminal in FIG. 3 starts the cycle of the whole encoder, which starts with the cycle of the slow disc circuit. This signal triggers "one-shot" or monostable multivibrator 82 of stage 1, which produces an output pulse. This pulse performs three functions. It samples the first-stage "and" gate 128, to determine whether the associated phototransister 118 is "lit". Additionally, after delay in element 84, it passes through OR-ing diode 86 to produce a clock pulse on clock pulse bus 88. Finally, the trailing edge of the delayed pulse triggers the next flip-flop 82 of the sequence of stages. All these operations are repeated in the successive stages until the first stage is reached whose phototransistor 118 is "lit".

If element 118 of the first stage is not lit, and for each following stage whose phototransistor is not "lit", a clock pulse passes through "and" gate 140 and "or" gate 142 to the slow-disc counter 144. At this time latch or bistable flip-flop 146 is reset, which therefore provides enabling input to the second input of "and" gate 140. If element 118 of the first stage is "lit", its associated gate 138 passed a pulse to the setting input of latch 146, blocking gate 140 and interrupting the entry of the first and all succeeding clock pulses into the counter. A count is entered into counter 144 for each stage up to the first "lit" phototransistor 118. Then latch 146 is set, and gate 140 is disabled from passing pulses to the counter.

The delay element 84 serves two purposes. It allows latch 146 to be set before its activating pulse reaches the clock pulse bus, and thus that pulse is not counted. The delay also provides time spacing between the clock-pulse output of each "one-shot" multivibrator 82 and the next.

The setting of latch 146 by a first pulse on output bus 126 not only applies bias to line 147, blocking gate 140 and preventing further clock pulses from entering the counter, but also applies enabling bias to "and" gate 148. If and when a second pulse appears on bus 126, two actions occur. First, "2-lit" latch 152 is set, developing a bias signal x for the circuit of FIG. 4. Additionally, a second pulse on bus 126 reaches "or" gate 142 via gate 148 and line 149, to supply an "add-one" pulse to counter 144.

The first pulse on bus 126 is supplied at terminal w as the "Start" signal of the fast-disc circuit of FIG. 4. The routine operation of the stages of FIG. 4 (bearing primed numerals corresponding to the components in FIG. 3) is the same as has been described for FIG. 3. Moreover, the operation of the remainder of FIG. 4, having parts of the "100"-series corresponding to those of FIG. 2, is the same as has been described for FIG. 2 and is not repeated here.

The various circuit elements shown in block-diagram form are commercially available and are described in the literature. See for example "How to Use Integrated Circuit Logic Elements" by Jack W. Streeter, published for Howard W. Sams by Bobbs, Merrill & Co.

The logic for precluding ambiguity is the same for the apparatus in FIGS. 3 and 4 as for that discussed in connection with FIGS. 1 and 2. The "2-lit" pulse generator 50 of FIG. 1 is omitted from FIG. 3 as being unnecessary.

At the time latch 146 is set, the slow-disc counter contains a count corresponding to the number of "unlit" stages, preceding the stage having the first "lit" phototransistor. An "add-one" count is then added to the counter if either a "2-lit" pulse appears on bus 126, or the count of the fast disc counter is less than 32.

The upshot is that:
(a) If only the first phototransistor 118 of the slow disc circuit is "lit", the fast-disc count is less than 32, and then conditions (a) or (b) of FIG. 5 or condition (a) of FIG. 6 is in effect. Therefore, an "add-one" pulse will be provided by the fast-disc circuit due to concurrence of the inputs to gate 166 and the slow-disc counter will read "0". (Counter 144 is reset to its maximum value of "1023" so that the first input pulse causes it to read "0".)
(b) If the first and second phototransistors 118 are "lit", condition (c) of FIG. 5 or condition (b), (c) or (d) of FIG. 6 prevails and, once again, an "add-on" pulse will be provided—this time by latch 146 enabling gate 148 to pass the second "lit" pulse from bus 126 to the counter. Here, too, the slow-disc counter 144 will read "0". Latch 152 will then produce bias signal x to disable the "less-than-32" add-one circuit 166, 170 of FIG. 4 Gate 140 was promptly blocked. Finally—
(c) If only one phototransistor 118 is "lit" and the fast-disc count is equal to or exceeds 32, condition (d) or (e) of FIG. 5 or condition (e) of FIG. 6 prevails. In that event, the first phototransistor 118 (FIG. 3) is not "lit" but the second one is lit so that a pulse from the "0" stage 82 reaches slow-disc counter 144 through gate 140. Again, the counter reads "0". Under this set of conditions, the add-one circuits 148, 149 and 152, 166, 170 do not operate.

It is not possible for two "add-one" pulses to be entered into the slow-disc counter for both occurrences of (1) two phototransistors being lit; and (2) the fast-disc counter being less than 32, because latch 152 is set by the second pulse from bus 126, and output x develops, disabling gate 166 from transmitting a "less-than-32" pulse. However, if only one pulse develops on bus 126 and latch 152 is not set, its Q terminal is "high". The resulting bias signal x enables gate 166. When counter 162 contains a value of less than 32, inverter 168 also applies enabling bias to gate 166. Thereafter the signal from the final stage 84' in FIG. 4 passes gate 166 and causes "one-shot" 170 to transmit signal y to gate 142 for entry of an "add-one" count into slow-disc counter 144.

During all of the range of operation of the fast disc, the fast-disc counter is caused to read various values up to 63, depending on the position of fast-disc 112'. An exact and unambiguous code representing the shaft position is produced. If the slow-disc counter were to read "0" when it is reset, it would be of no concern that the slow-disc counter would start with a code reading "1" (rather than "0") for the first rotation of the fast-disc 112'.

The system of FIGS. 3 and 4 (like that of FIGS. 1 and 2) has the merit in practice of being relatively non-critical with respect to minor dimensional variations of the sensitive areas and fringing effects at the edges of the beam, and with respect to centering of the slow-disc beam at the "1" phototransistor when the fast-disc beam is at "0".

Figure 7:
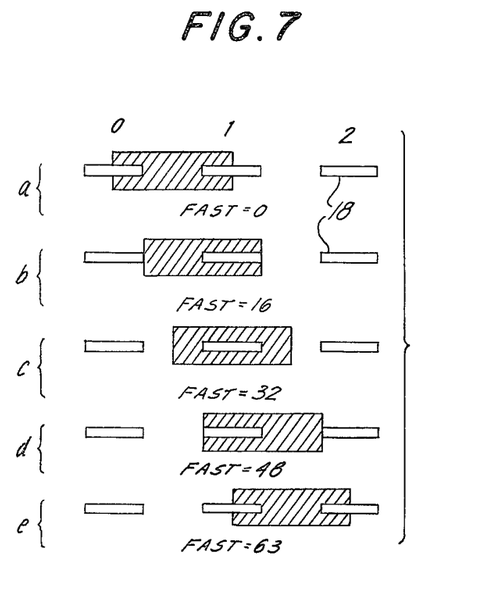
Figure 8:
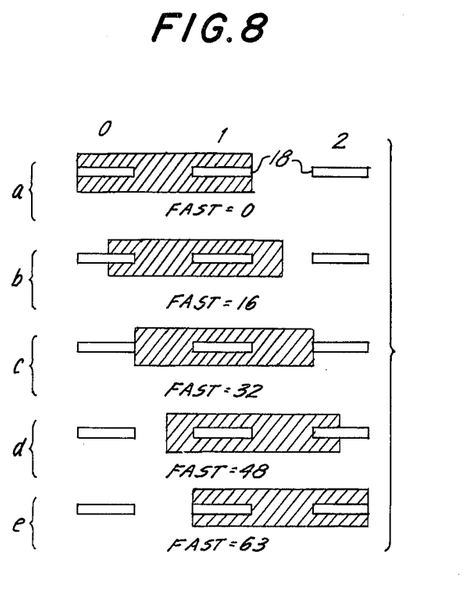

FIGS. 7 and 8 illustrate a modified relationship of the beam and the phototransistors, as compared to that of FIGS. 5 and 6. In FIGS. 7 and 8, the beam is centered midway between phototransistors "0" and "1" of the slow disc when the fast-disc counter reads zero.

As movement of the slow disc shifts the beam along the series of phototransistors in a system arranged per FIG. 7 or FIG. 8, the "1" phototransistor will be the only one "lit" for condition (b), (c) or (d) of FIG. 7 or condition (c) of FIG. 8. The slow-disc counter should register "1". More generally, when only the "$n^{th}$" phototransistor of the slow disc is lit, the correct value to be registered by the slow-disc counter is "n". Also, in condition (e) of FIG. 7 or condition (d) or (e) of FIG. 8, if the "1" (or the $n^{th}$) and the next following phototransistors are both "lit", then the fast-disc counter will exceed 32. Again, the slow-disc counter should read "1" (or "n"). However, in condition (a) of FIG. 7 or condition (a) or (b) of FIG. 8, when both the "1" (or the $n^{th}$) and the first (or preceding) phototransistors are "lit" ("first" or "preceding" in the sense of the testing sequence of the phototransistors) the fast-disc count will be less than 32. An "add-one" operation is needed for the slow-disc counter to register "1" (or n).

Hence, logically:

I. If only one phototransistor is "lit", the correct slow-disc count is represented by the first and only "lit" phototransistor, regardless of the value in the fast-disc counter.

II. If two phototransistors are "lit", the correct count is represented by:
(a) The first "lit" phototransistor plus one if the fast-disc counter registers less than 32; or
(b) The first "lit" phototransistor if the fast-disc counter registers 32 or more.

When the beam adjustment of FIG. 7 or FIG. 8 is used, slow-disc counters 44 and 144 are reset to read zero. The conditions in FIGS. 7 and 8 may be considered to represent a "1" (or "n") count registered in the slow-disc counter, when only one phototransistor is "lit" and when two are "lit" when the fast-disc count equals or exceeds 32. When two are "lit" and the fast-disc counter is less than 32, then "1" must be added to the slow-disc counter for the correct representation in the slow-disc counter.

The foregoing logic is satisfied by the system of FIGS. 1 and 2, provided that FIG. 1 is modified to derive signal x from the Q (true) output of "2-lit" latch 52, and further changed to omit connection 51. The stages 22 of the shift register are numbered to start with "0" as shown in the drawings. With these changes, the following actions occur:

i. When both the "0" (n−1) and the "1" (n) phototransistors 18 are "lit", gate 40 is blocked and thereby prevents the first clock pulse from reaching gate 42. However, latch 52 provides Q ("high") input to gate 66. The fast-disc counter registers less than 32, so pulse generator 70 delivers a y pulse to slow-disc counter 44.

ii. When only the "1" (or "n") phototransistor is "lit", the first ("0") phototransistor 18 is not lit, so that the first clock pulse reaches slow-disc counter 44 via gate 40. Latch 52 is not set, so no "high" x bias is available to enable gate 66. No y pulse is developed.

iii. When the "1" and "2" phototransistors 18 are lit, the first clock pulse passes gate 40 to slow-disc counter 44 because the phototransistor 18 of the "0" stage is dark. "Two-lit" latch 52 produces a "high" bias output x at one input of "and" gate 66. However the gate is blocked by a greater-than-32 input from fast-disc counter 62, so the y signal does not develop.

All that has been said of FIGS. 1 and 2 with respect to the beam relationships shown in FIGS. 7 and 8 is true of FIGS. 3 and 4. By changing the x output of "2-lit" latch 152 from the $\overline{Q}$ terminal to the Q terminal, and by omitting connection 151, the mode of operation of the circuit of FIGS. 1 and 2 is duplicated in the circuit of FIGS. 3 and 4.

In each of the foregoing examples, being variants of the concept of using the value in the fast-disc register to preclude ambiguity in the value registered in the slow-disc counter, the cycle of the slow-disc circuit precedes that of the fast-disc circuit, and the start of entries into each counter has been initiated at the start of the cycle of each such circuit and terminated with the detection of a "lit" phototransistor. Alternatives are readily envisioned.

As one such alternative system, the START signal can be used to initiate system operation at the fast-disc circuit. As applied to the circuit of FIGS. 1 and 2, START can be applied to the J input of latch 54 (FIG. 2) of the fast-disc circuit and input to the J terminal of latch 34 (FIG. 1) can be obtained from common bus 26' or from the last (63) stage 22' of the shift register in FIG. 2. The system-function signals such as "strobe" (signal z), "reset", and "Start" would then be derived either from the last stage (1023) of the slow-disc counter circuit in FIG. 1 or from bus 26, rather than from the last stage of the fast-disc circuit as in the system shown in FIGS. 1 and 2.

As a second of these alternatives, the Q output of latch 64 may be used to initiate input of pulses to be entered into fast-disc counter (rather than to terminate entry of pulses) so that the train of pulses to counter ends when the last (63) stage 22' is reached, followed after a delay by the cycle-ending functions. The slow-disc circuit can similarly be reversed, using the first "lit" phototransistor to initiate entry of pulses into the slow-disc counter, and then using the output of the last (1023) stage 22 to terminate pulse entry. Of course different but similar logic would be appropriate. Thus, in this alternative and with the beam adjustment of FIG. 5 or 6, the first "lit" phototransistor would initiate the pulses supplied to the slow-disc counter, using the Q output (rather than the $\overline{Q}$ output) of latch 46 for that purpose. The "32 or more" signal y from the fast-disc counter could then be used to produce an "add-one" pulse y for entry into the counter, provided that only one phototransistor was "lit". An "and" gate combining signal y and a "2-lit" signal from gate 48 would control entry of this "add-one" pulse into the counter. As a further modification, this last alternative could be used with the beam adjustment of FIGS. 7 and 8, and then the "2-lit" signal and the associated "and" gate would not be needed.

It is evident that the illustrative embodiments described above of various aspects of the invention are susceptible of a still further range of modification and may be combined with other apparatus by those skilled in the art, and therefore the invention should be construed broadly in accordance with its full spirit and scope.

What is claimed is:

1. A shaft position encoder including mechanism having a fast shaft and a slow shaft coupled together by gearing, said mechanism including the shaft whose position is to be encoded, said fast and slow shafts having a fast selector and a slow selector, respectively, a fast succession of elements and a slow succession of elements arranged in circles opposite the paths of said selectors, respectively, at least the slow succession of elements being distributed with uniform center-to-center distances and the gear ratio of said mechanism being such that the fast shaft causes its selector to traverse its succession of elements during the advance of the slow selector one center-to-center distance along the slow succession of elements, each of said selectors being proportioned to cooperate with at least one said element in all positions along its related succession of elements and therefore cooperating with more than one of said elements in certain of its positions, a fast counter and a slow counter related respectively to said fast and slow shafts, respective fast and slow means controlled by said fast and slow successions of elements and the fast and slow selectors in cooperation therewith for causing operation of the counters in accordance with the number of elements between one end of each said succession of elements and a said element cooperating with its related selector, and means at least partially controlled by said fast counter for determining unambiguously the number of pulses to be registered by the slow counter.

2. A shaft position encoder as in claim 1 wherein said respective fast and slow means provide trains of pulses to the respective counters limited in accordance with the number of elements between one end of each said succession of elements and a said element cooperating with its related selector.

3. A shaft position encoder as in claim 1, wherein each of said fast and slow pulse train providing means includes a shift register having a succession of stages each combined with a respective one of said elements.

4. A shaft position encoder as in claim 3, wherein each of said fast and slow pulse train providing means includes a succession of monostable multivibrator stages that control and are controlled by one another in succession, each said stage being combined with a respective one of said elements.

5. A shaft position encoder as in claim 3, wherein said elements of the slow succession are photosensitive devices of uniform effective width and wherein said slow selector is a means for providing a light beam whose effective width at said elements is in the range of about one to one-and-one-half times the center-to-center distance of said elements.

6. A shaft position encoder as in claim 5, wherein said beam is centered with respect to a said photosensitive device when said fast selector is in cooperation with the first of said fast succession of elements.

7. A shaft position encoder as in claim 5, wherein said beam is centered between two successive photosensitive devices when said fast selector is in cooperation with the first of said fast succession of elements.

8. A shaft position encoder as in claim 5, wherein said means for determining unambiguously the number of pulses to be registered by the slow counter includes first pulse entry means responsive to the fast counter and second pulse entry means responsive to cooperation of the slow selector with two elements of said slow succession thereof.

9. A shaft position encoder as in claim 8, wherein said beam is centered with respect to a said photosensitive device when said fast selector is in cooperation with the first of said fast succession of elements, wherein said first pulse-entry means acts to provide a pulse for entry into the slow counter when the fast selector is in cooperation with a fast element in the lower part of the fast succession of elements and wherein said second pulse entry means acts in response to said cooperation of the slow selector with two slow elements to suppress entry of a pulse by said first pulse-entry means and to cause entry of a pulse into the slow counter.

10. A shaft position encoder as in claim 8, wherein said beam is centered between two successive photosensitive devices when said fast selector is in cooperation with the first of said fast succession of elements, wherein said first pulse entry means and said second pulse entry means act jointly to cause entry of a pulse into the slow counter only when the fast selector is in cooperation with an element in the upper part of the fast succession of elements and when the slow selector is in cooperation with two of the slow succession of elements.

11. A shaft position encoder as in claim 1, wherein each of said fast and slow means controlled by said fast and slow successions of elements operates in its own sub-cycle, each being arranged to initiate the operation of the other.

12. A shaft position encoder including mechanism having a fast shaft and a slow shaft coupled together by gearing, said mechanism including the shaft whose position is to be encoded, said fast and slow shafts having a fast selector and a slow selector, respectively, a fast succession of elements and a slow succession of elements arranged in circles opposite the paths of said selectors, respectively, at least the slow succession of elements being distributed with uniform center-to-center distances and the gear ratio of said mechanism being such that the fast shaft causes its selector to traverse its succession of elements during the advance of the slow selector one center-to-center distance along the slow succession of elements, each of said selectors being proportioned to cooperate with at least one said element in all positions along its related succession of elements and therefore cooperating with more than one of said elements in certain of its positions, a fast counter and a slow counter related respectively to said fast and slow shafts, respective fast and slow means controlled by said fast and slow successions of elements and the fast and slow selectors in cooperation therewith for providing trains of pulses to the respective counters limited in accordance with the number of elements between one end of each said succession of elements and a said element cooperating with its related selector, each of said fast and slow means being arranged to operate in its own sub-cycle and each being arranged to initiate operation of the other.

* * * * *